(12) United States Patent
Yeh et al.

(10) Patent No.: US 10,535,673 B2
(45) Date of Patent: Jan. 14, 2020

(54) HIGH-DENSITY FLASH MEMORY DEVICE AND METHOD OF MANUFACTURING THE SAME

(71) Applicant: Macronix International Co., Ltd., Hsinchu (TW)

(72) Inventors: Teng-Hao Yeh, Hsinchu (TW); Chih-Wei Hu, Miaoli County (TW); Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 15/996,617

(22) Filed: Jun. 4, 2018

(65) Prior Publication Data

US 2019/0371804 A1    Dec. 5, 2019

(51) Int. Cl.
| | |
|---|---|
| *H01L 27/11* | (2006.01) |
| *H01L 27/11556* | (2017.01) |
| *G11C 16/10* | (2006.01) |
| *H01L 27/11524* | (2017.01) |
| *H01L 27/1157* | (2017.01) |
| *H01L 27/11582* | (2017.01) |
| *H01L 27/11565* | (2017.01) |
| *G11C 16/04* | (2006.01) |
| *G11C 11/56* | (2006.01) |
| *H01L 27/11519* | (2017.01) |

(52) U.S. Cl.
CPC ........ *H01L 27/11556* (2013.01); *G11C 16/10* (2013.01); *H01L 27/1157* (2013.01); *H01L 27/11524* (2013.01); *H01L 27/11582* (2013.01); *G11C 11/5628* (2013.01); *G11C 11/5671* (2013.01); *G11C 16/0483* (2013.01); *H01L 27/11519* (2013.01); *H01L 27/11565* (2013.01)

(58) Field of Classification Search
CPC ......... H01L 27/11556; H01L 27/11582; H01L 27/1157; H01L 27/11565; H01L 27/11524; H01L 27/11519; G11C 16/10; G11C 16/0483; G11C 11/5671; G11C 11/5628
See application file for complete search history.

(56) References Cited

U.S. PATENT DOCUMENTS

| | | | |
|---|---|---|---|
| 7,087,950 B2* | 8/2006 | Willer | H01L 27/115 257/314 |
| 7,936,004 B2* | 5/2011 | Kito | H01L 21/8221 257/324 |
| 8,372,720 B2* | 2/2013 | Fukuzumi | G11C 16/0483 438/287 |

(Continued)

*Primary Examiner* — Vanthu T Nguyen
(74) *Attorney, Agent, or Firm* — Fish & Richardson P.C.

(57) ABSTRACT

A memory device that includes: a memory controller; a control unit; and a memory cell array that includes memory blocks, each memory block comprising: memory cells, word lines respectively coupled to the memory cells, signal lines to transfer signals to perform programming operations to one or more memory cells of the memory cells, a first metal layer coupled to a first group of lines and configured to route the first group of the lines to the control unit, the lines comprising the word lines and the signal lines, and a second metal layer coupled to a second group of the lines and configured to route the second group of the lines to the control unit, wherein the memory controller is configured to: control the control unit to (i) select particular memory cells and (ii) program data to the particular memory cells is disclosed.

18 Claims, 10 Drawing Sheets

(56) References Cited

U.S. PATENT DOCUMENTS

| | | | |
|---|---|---|---|
| 8,952,426 B2* | 2/2015 | Maejima | H01L 27/11565 |
| | | | 257/214 |
| 9,142,538 B1* | 9/2015 | Chen | H01L 27/0207 |
| 9,218,853 B2* | 12/2015 | Lin | G11C 5/02 |
| 9,711,226 B2* | 7/2017 | Maejima | G11C 16/16 |
| 9,859,207 B2* | 1/2018 | Kim | H01L 23/5226 |
| 2016/0260722 A1* | 9/2016 | Baba | H01L 27/11582 |

* cited by examiner

HIGH-DENSITY FLASH MEMORY DEVICE AND METHOD OF MANUFACTURING THE SAME

TECHNICAL FIELD

The present application relates to a memory device. In particular, the present application relates to various structures of a memory device.

BACKGROUND

A memory device, e.g., a high-density NAND flash memory device, can have various structures to increase the density of memory cells and lines on a chip. In particular, 3D NAND structures have been used to implement high-density NAND flash memory devices.

SUMMARY

The present application describes techniques related to a structure of a memory device. In particular, the structure of the memory device enables reduction of the number of programming sessions by reducing the number of string select lines in one memory block. As a result, the memory device can prevent the tail-bit problem, which in turn can reduce programming errors.

In addition, the memory device includes two separate metal layers to route various lines to and/or from control units such as a row decoder, a column decoder, or a voltage supplier. Thus, the memory device can have satisfactory word line pitch even if the number of the string select lines in one memory block is reduced. This enables reduction of the likelihood of dielectric breakdown in a memory cell caused by a low word line pitch, improving the reliability and the accuracy of the memory device.

In general, one innovative aspect of the subject matter described in this specification can be implemented in a memory device that includes: a memory controller; one or more control units; and a memory cell array that includes one or more memory blocks, each of the one or more memory block comprising: a plurality of memory cells, a plurality of word lines that are respectively coupled to the plurality of memory cells, a plurality of signal lines to transfer signals to perform programming operations to one or more memory cells of the plurality of memory cells, a first metal layer that is coupled to a first group of lines and that is configured to route the first group of the lines to at least one of the one or more control units, the lines comprising the plurality of word lines and the plurality of signal lines, and a second metal layer that is coupled to a second group of the lines and that is configured to route the second group of the lines to at least one of the one or more control units, wherein the memory controller is configured to: control at least one of the one or more control units to (i) select one or more particular memory cells and (ii) program one or more data to the one or more particular memory cells.

The foregoing and other implementations can each optionally include one or more of the following features, alone or in combination. In particular, one implementation includes all the following features in combination. The plurality of signal lines include string select lines, common source lines, dummy word lines, ground select lines, and inversion word lines. The first metal layer includes a first routing line that is coupled to at least one of the one or more control units and the second metal layer includes a second routing line that is coupled to at least one of the one or more control units. A pitch for the first routing line is the same as a pitch for the second routing line. The first routing line is aligned with the second routing line. The second metal layer is discontinuous between a first portion and a second portion, and wherein the first portion of the second metal layer is coupled to the second portion of the second metal layer through a detouring portion of the second metal layer. The memory device further includes: a first conductive layer that is adjacent to the second metal layer, wherein the second metal layer is discontinuous between a first portion and a second portion, and wherein the first portion of the second metal layer is coupled to the first conductive layer and the second portion of the second metal layer is coupled to the first conductive layer such that a signal is transferred between the first portion and the second portion through the first conductive layer. The memory device further includes: a first conductive layer that is adjacent to the second metal layer, wherein the second metal layer is discontinuous between a first portion and a second portion, wherein the first conductive layer is discontinuous between a third portion and a fourth portion, and wherein (i) the first portion of the second metal layer is coupled to the third portion of the first conductive layer, (ii) the second portion of the second metal layer is coupled to the fourth portion of the first conductive layer, and (iii) the third portion of the first conductive layer is coupled to the fourth portion of the first conductive layer through a detouring portion of the first conductive layer such that a signal is transferred between the first portion and the second portion through the third portion, the detouring portion, and the fourth portion of the first conductive layer. An average pitch for the lines is more than 0.1 um. The second metal layer is further from the lines than the first metal layer.

In general, another innovative aspect of the subject matter described in this specification can be implemented in a method for programming one or more data to one or more memory cells of a memory device, the method comprising: receiving addresses for one or more memory cells to program; selecting, based on the addresses, the one or more memory to program through a plurality of word lines that are respectively coupled to a plurality of memory cells in the memory device and a plurality of signal lines that are configured to transfer signals to perform programming operations to the one or more memory cells; and applying, by a memory controller, one or more voltages to the one or more memory cells to program the one or more memory cells through the plurality of word lines and the plurality of signal lines, wherein a first metal layer is coupled to a first group of lines and is configured to route the first group of the lines to at least one of one or more control units, the lines comprising the plurality of word lines and the plurality of signal lines, and wherein a second metal layer is coupled to a second group of the lines and is configured to route the second group of the lines to at least one of the one or more control units.

The foregoing and other implementations can each optionally include one or more of the following features, alone or in combination. In particular, one implementation includes all the following features in combination. The plurality of signal lines include string select lines, common source lines, dummy word lines, ground select lines, and inversion word lines. The first metal layer includes a first routing line that is coupled to at least one of the one or more control units and the second metal layer includes a second routing line that is coupled to at least one of the one or more control units. A pitch for the first routing line is the same as a pitch for the second routing line. The first routing line is aligned with the second routing line in a particular direction. The second metal layer is discontinuous between a first portion and a second portion, and wherein the first portion of the second metal layer is coupled to the second portion of the second metal layer through a detouring portion of the second metal layer. The method further includes: a first conductive layer that is adjacent to the second metal layer, wherein the second metal layer is discontinuous between a first portion and a second portion, and wherein the first portion of the second metal layer is coupled to the first conductive layer and the second portion of the second metal layer is coupled to the first conductive layer such that a signal is transferred between the first portion and the second portion through the first conductive layer. The memory device further comprises a first conductive layer that is adjacent to the second metal layer, wherein the second metal layer is discontinuous between a first portion and a second portion, wherein the first conductive layer is discontinuous between a third portion and a fourth portion, and wherein (i) the first portion of the second metal layer is coupled to the third portion of the first conductive layer, (ii) the second portion of the second metal layer is coupled to the fourth portion of the first conductive layer, and (iii) the third portion of the first conductive layer is coupled to the fourth portion of the first conductive layer through a detouring portion of the first conductive layer such that a signal is transferred between the first portion and the second portion through the third portion, the detouring portion, and the fourth portion of the first conductive layer. An average pitch for the lines is more than 0.1 um. The second metal layer is further from the lines than the first metal layer.

The details of one or more examples of the subject matter described in this specification are set forth in the accompanying drawings and the description below. Other potential features, aspects, and advantages of the subject matter will become apparent from the description, the drawings, and the claim.

BRIEF DESCRIPTION OF THE DRAWINGS

Like reference numbers and designations in the various drawings indicate like elements. It is also to be understood that the various exemplary implementations shown in the figures are merely illustrative representations and are not necessarily drawn to scale.

DETAILED DESCRIPTION

Figure 1:
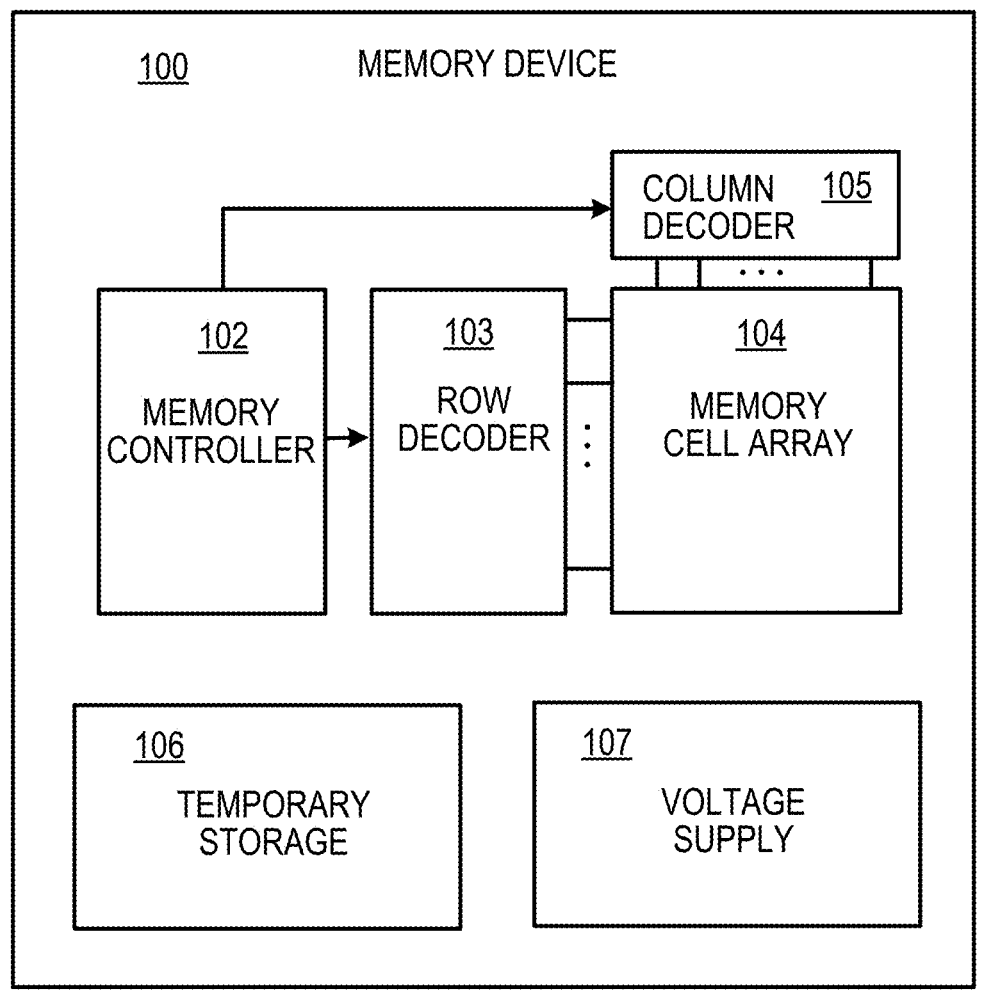
FIG. 1 illustrates an example memory device.

FIG. 1 illustrates an example memory device 100. The memory device 100 includes a memory controller 102 and a memory cell array 104. The memory controller 102 includes hardware and software logic to perform various operations, which include programming the memory array 104, e.g., writing to, reading from, or erasing from the memory array 104. In some implementations, the memory controller 102 includes one or more processors to program memory cells in the memory cell array 104. For example, the memory controller 102 can execute operations to program the memory array 104. The operations can be stored in a storage accessible by the memory controller 102. In some implementations, the operations can be stored at a flash memory or a hard disk. In some implementations, the operations can be stored at a temporary storage. In some implementations, the operations can be stored in a dedicated portion of the memory array 104 that is distinct from the memory cells that are to be programmed.

The memory array 104 includes one or more memory blocks. In some implementations, each of the memory blocks may include a plurality of memory cell strings. A string can include a plurality of memory cells. The memory cells can be single-level cells or multi-level cells. In some implementations, the memory array 104 includes nonvolatile memory cells, e.g., a flash memory cells. However, the memory array 104 can include any type of memory cells including, but not limited to, 2D NAND flash memory cells, 3D NAND flash memory cells comprising U-shaped strings, and 3D NAND flash memory cells comprising non-U-shaped strings. In some implementations, each of the memory blocks may include a single string.

The memory device 100 includes a row decoder 103 and a column decoder 105. In some implementations, the row decoder is coupled to a plurality of word lines that are arranged in a first direction in the memory array 104 and the column decoder 105 is coupled to a plurality of bit lines that are arranged in a second direction in the memory array 104. In some other implementations, the row decoder is coupled to a plurality of bit lines that are arranged in a first direction in the memory array 104 and the column decoder 105 is coupled to a plurality of word lines that are arranged in a second direction in the memory array 104.

The memory controller 102 can control reading or programming operations to one or more memory cells in the memory cell array 104 using the row decoder 103 or the column decoder 105. In some implementations, the memory controller 102 provides addresses to the row decoder 103 and the column decoder 105 to perform reading or programming operations to one or more particular memory cells in the memory cell array 104. In some other implementations, addresses can be provided from an external device or an external circuit to the row decoder 103 and the column decoder 105 to perform reading or programming operations to one or more particular memory cells in the memory cell array 104.

In some implementations, the memory device 100 includes a voltage supply 107. The memory controller 102 controls the voltages supply 107 to provide power for the memory cell array 104. The memory controller 102 can perform read and programming operations using power provided from the voltage supply 107.

In some implementations, the memory device 100 can further include a temporary storage 106 to store information for programming memory cells in the memory cell array 104. The information can include different voltages levels, and timing data to define the times during which the different voltage levels are applied to the memory cell array. A variety of formats are possible for the timing data for the different voltage level to be applied to the memory cell array, e.g., a start time and an end time for a particular voltage level, or a start time and a duration for the particular voltage level. The temporary storage 106 can be any type of suitable storage. For example, the temporary storage 106 can be static random access memory (SRAM), NAND flash memory, or a set of registers. In some implementations, the temporary storage 106 can be implemented as a portion of the memory array 104, which can be distinct from the memory cells that are to be programmed.

Figure 2:
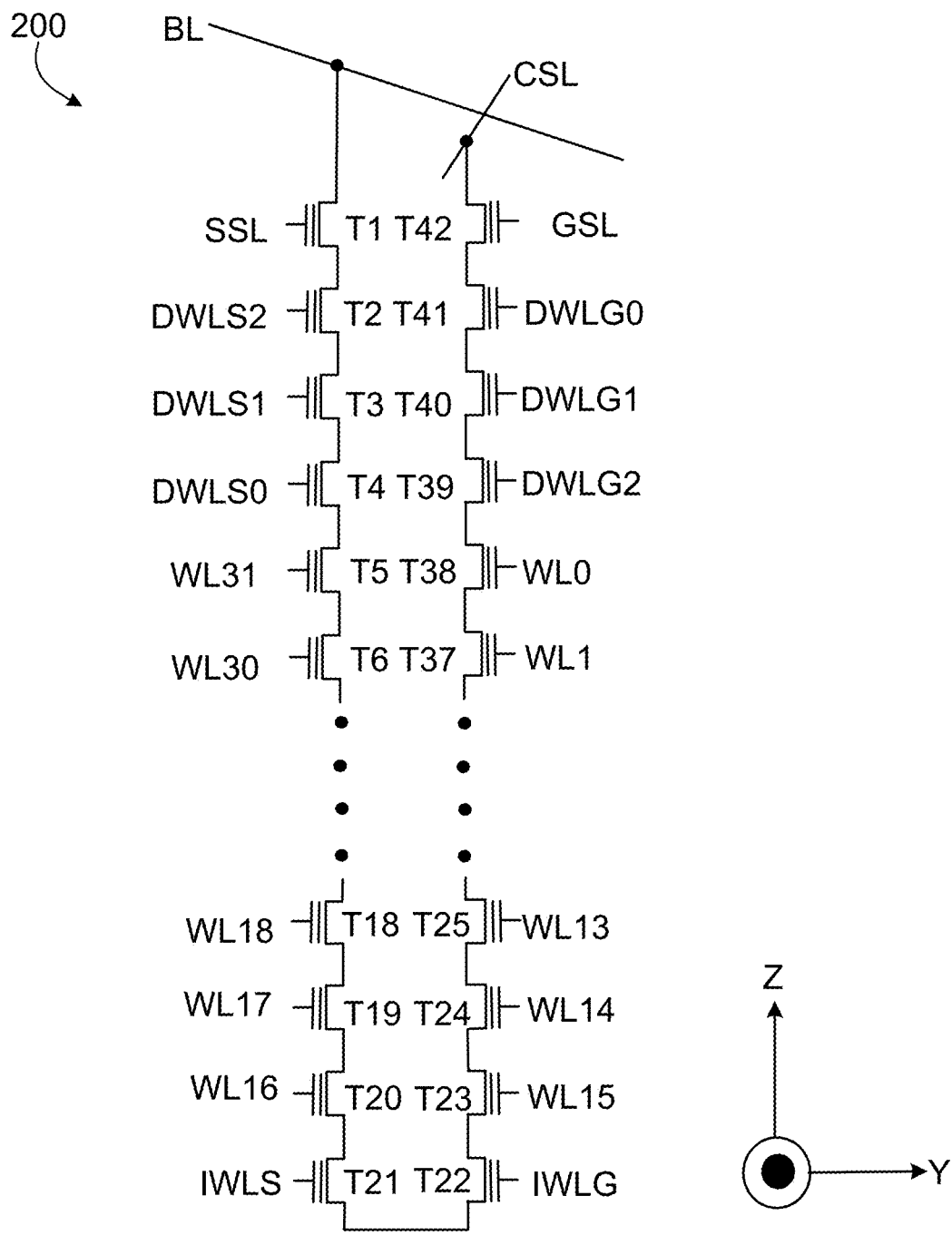
FIG. 2 illustrates an example circuit diagram for a memory cell string of a memory cell array.

FIG. 2 illustrates an example circuit diagram for a memory cell string of a memory cell array. In particular, FIG. 2 illustrates a circuit diagram for the memory cell string 200 in the Y-Z plane (the surface of the wafer on which the cell is fabricated would provide the X-Y plane). The memory cell array including the memory cell string 200 can be the memory cell array 104 illustrated in FIG. 1. The memory cell array can include multiple signal lines. For example, the signal lines can include string select lines, common source lines, dummy word lines, ground select lines, and inversion word lines. However, examples of the signal lines are not limited to the lines described here. Any suitable lines that are configured to transfer one or more signals can be signal lines. In FIG. 2, the memory cell string 200 includes a common source line CSL that extends in a first direction, e.g., in an X-X direction, and a bit line BL that extends in a second direction, e.g., in an Y-Y direction. In some implementations, the first direction can be perpendicular to the second direction. In some implementations, the first direction can be parallel to the second direction. In other implementations, the first direction can extend at an angle greater than 0 and less than 90 degrees relative to the second direction. The common source line CSL is connected to a plurality of memory cells along the X-X direction, and the bit line BL is connected to a plurality of memory cells along the Y-Y direction.

The bit line BL is coupled to a plurality of transistors. For example, the bit line BL is coupled to the transistors T1-T21. The transistors T1-T21 can be implemented with various types of transistors including, but not limited to, a bipolar junction transistor, a p-channel Metal Oxide Semiconductor (PMOS) transistor, an n-channel Metal Oxide Semiconductor (NMOS) transistor, a complementary Metal Oxide Semiconductor (CMOS) transistor, or other types of transistors and memory cells. In some implementations, the transistors T1-T21 can be the same type of transistors. In some implementations, the transistor T1 coupled to the string select line SSL, the transistors T2-T4 coupled to the dummy word lines DWLS0-DWLS2, the transistors T5-T20 coupled to the word lines WL31-WL16, and the transistor T21 coupled to the inversion word line IWLS can be implemented using two or more types of transistors.

The transistor T1 is coupled to the string select line SSL. The source of the transistor T1 is coupled to the bit line BL, the gate of the transistor T1 is coupled to the string select line SSL, and the drain of the transistor T1 is coupled to the transistor T2. The transistor T1 is turned on or off based on the voltage provided through the string select line SSL. For example, when a voltage over a threshold level is provided to the gate of the transistor T1 through the string select line SSL, the transistor T1 is turned on so that current flows from the bit line BL to the transistor T2.

The transistors T2-T4 are coupled to dummy word lines DWLS2-DWLS0. The source of the transistor T2 is coupled to the drain of the transistor T1, the gate of the transistor T2 is coupled to the dummy word line DWLS2, and the drain of the transistor T2 is coupled to the transistor T3. The transistor T2 is turned on or off based on the voltage provided through the dummy word line DWLS2. For example, when a voltage over a threshold level is provided to the gate of the transistor T2 through the dummy word line DWLS2, the transistor T2 is turned on so that current flows from the transistor T1 to the transistor T3.

The source of the transistor T3 is coupled to the drain of the transistor T2, the gate of the transistor T3 is coupled to the dummy word line DWLS1, and the drain of the transistor T3 is coupled to the transistor T4. The transistor T3 is turned on or off based on the voltage provided through the dummy word line DWLS1. For example, when a voltage over a threshold level is provided to the gate of the transistor T3 through the dummy word line DWLS1, the transistor T3 is turned on so that current flows from the transistor T2 to the transistor T4. In some implementations, the transistors T2, T3 have a common gate. That is, the dummy word line DWLS2 and the dummy word line DWLS1 are connected to each other. In these implementations, the transistors T2, T3 can be simultaneously turned on or off based on the voltage applied to the common gate. In some implementations, the transistors T2, T3 can be inversely turned on or off, based on the voltage applied to the common gate, using one or more inverters coupled to the common gate.

The source of the transistor T4 is coupled to the drain of the transistor T3, the gate of the transistor T4 is coupled to the dummy word line DWLS0, and the drain of the transistor T4 is coupled to the transistor T5. The transistor T4 is turned on or off based on the voltage provided through the dummy word line DWLS0. For example, when a voltage over a threshold level is provided to the gate of the transistor T4 through the dummy word line DWLS0, the transistor T4 is turned on so that current flows from the transistor T3 to the transistor T5.

The transistors T5-T20 are respectively coupled to the word lines WL31-WL16. The gate of each transistor of the transistors T5-T20 is coupled to a respective word line of the word lines WL31-WL16. Each transistor of the transistors T5-T20 is turned on or off based on the voltage provided through the respective word line of the word lines WL31-WL16. For example, when a voltage over a threshold level is provided to the gate of the transistor of the transistors T5-T20 through the respective word line, the transistor is turned on so that current flows through the transistor. Each of the word lines WL31-16 is coupled to a plurality of memory cells.

The transistor T21 is coupled to the inversion word line IWLS. The gate of the transistor T21 is coupled to the inversion word line IWLS. The transistor T21 is turned on or off based on the voltage provided through the inversion word line IWLS. For example, when a voltage over a threshold level is provided to the gate of the transistor T21 through the inversion word line IWLS, the transistor T21 is turned on so that current flows from the transistor T20 to the transistor T22.

The source of the transistor T22 is coupled to the drain of the transistor T21. In addition, the transistor T22 is coupled to the inversion word line IWLG. The gate of the transistor T22 is coupled to the inversion word line IWLG. The transistor T22 is turned on or off based on the voltage provided through the inversion word line IWLG. For example, when a voltage over a threshold level is provided to the gate of the transistor T22 through the inversion word line IWLG, the transistor T22 is turned on so that current flows from the transistor T21 to the transistor T23.

In some implementations, the transistors T21, T22 are driven by a common driver. That is, the same voltage is applied to the gates of the transistors T21, T22 through the inversion word line IWLS and the inversion word line IWLG. In these implementations, the transistors T21, T22 can be simultaneously turned on or off based on the voltage applied to the gates of the transistors T21, T22. For example, when a voltage over a threshold is provided by the common driver to the gates of the transistors T21, T22, the transistors T21, T22 can be turned on together at the same time so that current can flow from the transistor T20 coupled to the word line WL16 to the transistor T23 coupled to the word line WL15. In some implementations, the transistors T21, T22 can be inversely turned on or off based on the voltage applied to the gates of the transistors T21, T22 using one or more inverters coupled to the gates.

The transistors T23-T38 are respectively coupled to the word lines WL15-WL0. In particular, the gate of each transistor of the transistors T23-T38 is coupled to a respective word line of the word lines WL15-WL0. Each transistor of the transistors T23-T38 is turned on or off based on the voltage provided through the respective word line of the word lines WL15-WL0. For example, when a voltage over a threshold level is provided to the gate of the transistor of the transistors T23-T38 through the respective word line, the transistor is turned on so that current flows through the transistor. Each of the word lines WL15-WL0 is coupled to a plurality of memory cells.

The transistors T39-T41 are respectively coupled to dummy word lines DWLG2-DWLG0. The source of the transistor T39 is coupled to the drain of the transistor T38, the gate of the transistor T39 is coupled to the dummy word line DWLG2, and the drain of the transistor T39 is coupled to the transistor T40. The transistor T39 is turned on or off based on the voltage provided through the dummy word line DWLG2. For example, when a voltage over a threshold level is provided to the gate of the transistor T39 through the dummy word line DWLG2, the transistor T39 is turned on so that current flows from the transistor T38 to the transistor T40.

In some implementations, the transistors T39, T4 have a common gate. That is, the dummy word line DWLG2 and the dummy word line DWLS0 are connected to each other. In these implementations, the transistors T39, T4 can be simultaneously turned on or off based on the voltage applied to the common gate. In some implementations, the transistors T39, T4 can be inversely turned on or off based on the voltage applied to the common gate using one or more inverters coupled to the common gate.

The source of the transistor T40 is coupled to the drain of the transistor T39, the gate of the transistor T40 is coupled to the dummy word line DWLG1, and the drain of the transistor T40 is coupled to the transistor T41. The transistor T40 is turned on or off based on the voltage provided through the dummy word line DWLG1. For example, when a voltage over a threshold level is provided to the gate of the transistor T40 through the dummy word line DWLG1, the transistor T40 is turned on so that current flows from the transistor T39 to the transistor T41.

The source of the transistor T41 is coupled to the drain of the transistor T40, the gate of the transistor T41 is coupled to the dummy word line DWLG0, and the drain of the transistor T41 is coupled to the transistor T42. The transistor T41 is turned on or off based on the voltage provided through the dummy word line DWLG0. For example, when a voltage over a threshold level is provided to the gate of the transistor T41 through the dummy word line DWLG0, the transistor T41 is turned on so that current flows from the transistor T40 to the transistor T42. In some implementations, the transistors T40, T41 have a common gate. That is, the dummy word line DWLG1 and the dummy word line DWLG0 are connected to each other. In these implementations, the transistors T40, T41 can be simultaneously turned on or off based on the voltage applied to the common gate. In some implementations, the transistors T40, T41 can be inversely turned on or off, based on the voltage applied to the common gate, using one or more inverters coupled to the common gate.

The transistor T42 is coupled to the ground select line GSL. The source of the transistor T42 is coupled to the drain of the transistor T41, the gate of the transistor T42 is coupled to the ground select line GSL, and the drain of the transistor T42 is coupled to the common source line CSL. The transistor T42 is turned on or off based on the voltage provided through the ground select line GSL. For example, when a voltage over a threshold level is provided to the gate of the transistor T42 through the ground select line GSL, the transistor T42 is turned on so that current flows from the transistor T41 to the common source line CSL.

The common source line CSL is coupled to a plurality of transistors T22-T42 as described above. The transistors T22-T42 can be implemented with various kinds of transistors including, but not limited to, a bipolar junction transistor, a PMOS transistor, a NMOS transistor, a CMOS transistor, or other types of transistors and memory cells. In some implementations, the transistors T22-T42 can be the same type of transistors. In some implementations, the transistor T42 coupled to the ground select line GSL, the transistors T39-T41 coupled to the dummy word lines DWLG2-DWLG0, the transistors T23-T38 coupled to the word lines WL15-WL0, and the transistor T22 coupled to the inversion word line IWLG can be implemented using two or more types of transistors.

Figure 3A:
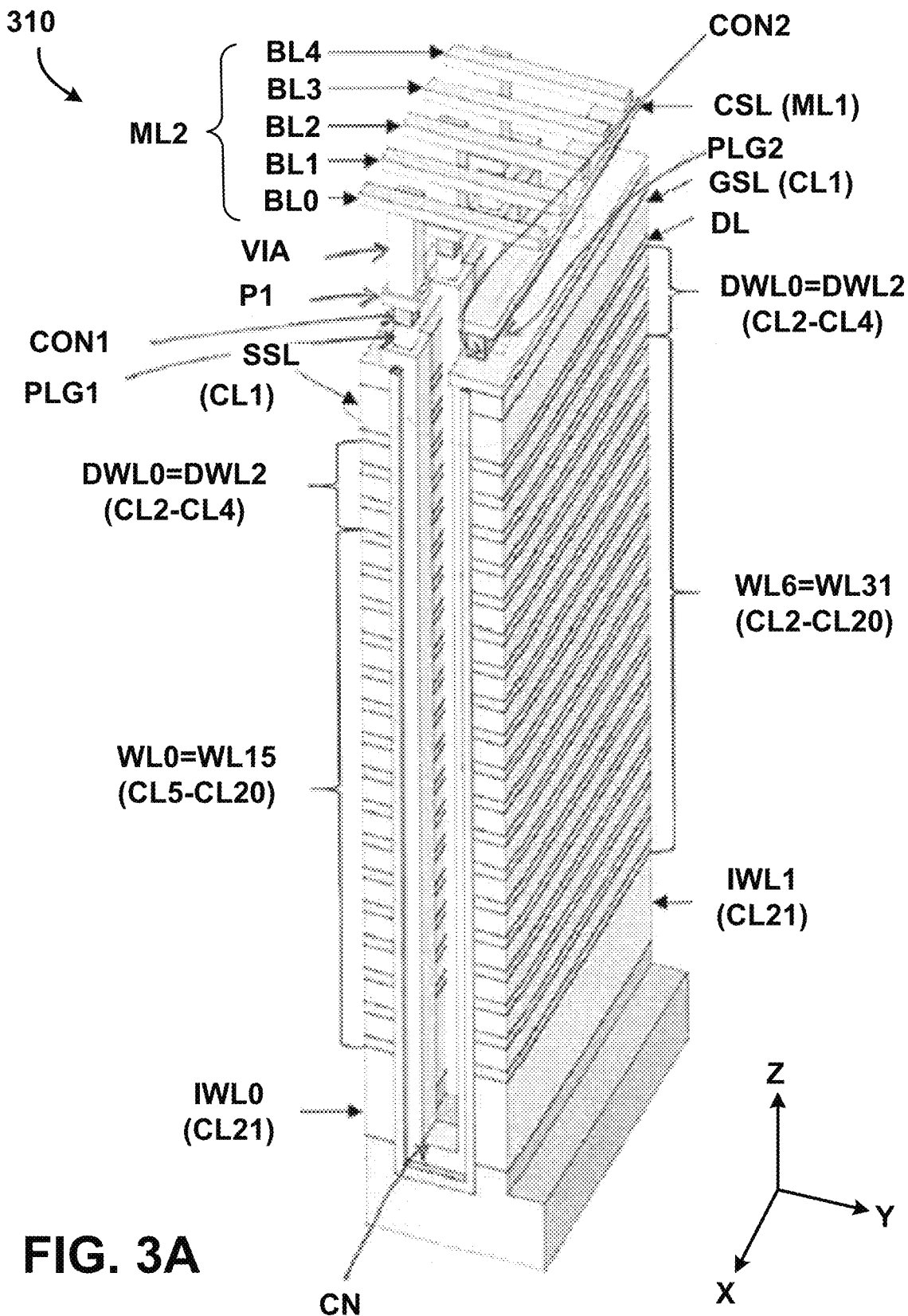
FIG. 3A illustrates a perspective view of an example structure of a memory cell array.

FIG. 3A illustrates an example structure of a memory cell array. In particular, FIG. 3A illustrates a memory cell string 310 of the memory cell array. In this example, the memory cell string has a 3D NAND structure. However, the structure of the memory cell string is not limited to a 3D NAND structure, but can be any suitable structure including a 2D NAND structure. In some implementations, the memory cell array including the memory cell string can be the memory cell array 104 described with reference to FIG. 1. In addition, the structure of the memory cell string illustrated in FIG. 3A can be a structure to implement the circuit of the memory cell string illustrated in FIG. 2. The memory cell string includes a multilayer lamination of conductive layers, e.g., metal layers or polysilicon layers. For example, the memory cell array includes M (where M is an integer >0) layers of circuitry, with each layer of circuitry provided by a different conductive layer. The memory cell string 310 can include array layers and peripheral layers.

In some implementations, the array layers include conductive layers. For example, the array layers can include twenty-one conductive layers CL1-CL21, of circuitry. The conductive layer CL1 includes a string select line SSL and a ground select line GSL, the conductive layers CL2-CL4 respectively include a plurality of dummy word lines DWL0-DWL2, the conductive layers CL5-CL20 respectively include a plurality of word lines WL0-31, and the conductive layer CL21 includes a plurality of inversion word lines IWL0-IWL1.

In some implementations, the peripheral layers include metal layers. For example, the peripheral layers can include two metal layers, ML1, ML2, of circuitry. The first metal layer ML1 can include one or more common source lines, e.g., the common source line CSL. The common source line CSL can be coupled to a control unit, e.g., a row decoder, a column decoder, or a voltage supplier, through the first metal layer ML1. The second metal layer ML2 can include one or more bit lines, e.g., the bit lines BL0-BL4. The bit lines BL0-BL4 can be coupled to a control unit, e.g., a row decoder, a column decoder, or a voltage supplier, through the second metal layer ML2.

A memory controller, e.g., the memory controller 102 in FIG. 1, can perform reading or programming operations by providing signals, e.g., applying suitable voltages, through the bit lines and the common source lines in the metal layers. In some implementations, where a particular voltage is applied to the bit lines BL0, the voltage is provided to the channel CN of the memory cell string 310 through a via VIA, a post P1, a first contact CON1, and a first plug PLG1 of the memory cell string 310. By controlling the channel potential of the channel CN, the memory controller can perform reading or programming operations. In some implementations, where carriers are transferred from one or more memory cells to the channel CN through respective word lines of the word lines WL0-WL31, the carriers change the channel potential of the channel CN. A particular voltage based on the channel potential of the channel CN is provided to a control unit, e.g., a row decoder, a column decoder, or voltage supplier, through a second plug PLG2 and a second contact CON2.

In some implementations, one or more dielectric layers are provided between two adjacent conductive layers of the multilayer lamination to electrically insulate those conductive layers each other. For example, in FIG. 3A, a dielectric layer DL is provided between the conductive layer CL1 and the conductive layer CL2. In these implementations, any suitable technique can be used to insulate two adjacent conductive layers of the multilayer lamination each other.

In this example structure of the memory cell string illustrated in FIG. 3A, the number of layers of circuitry and the number of the various lines including bit lines, string select lines, word lines, common source lines, dummy word lines, ground select lines, and inversion word lines, are not limited to a particular number. The memory cell array can include any suitable number of layers of circuitry and lines in various implementations.

Figure 3B:
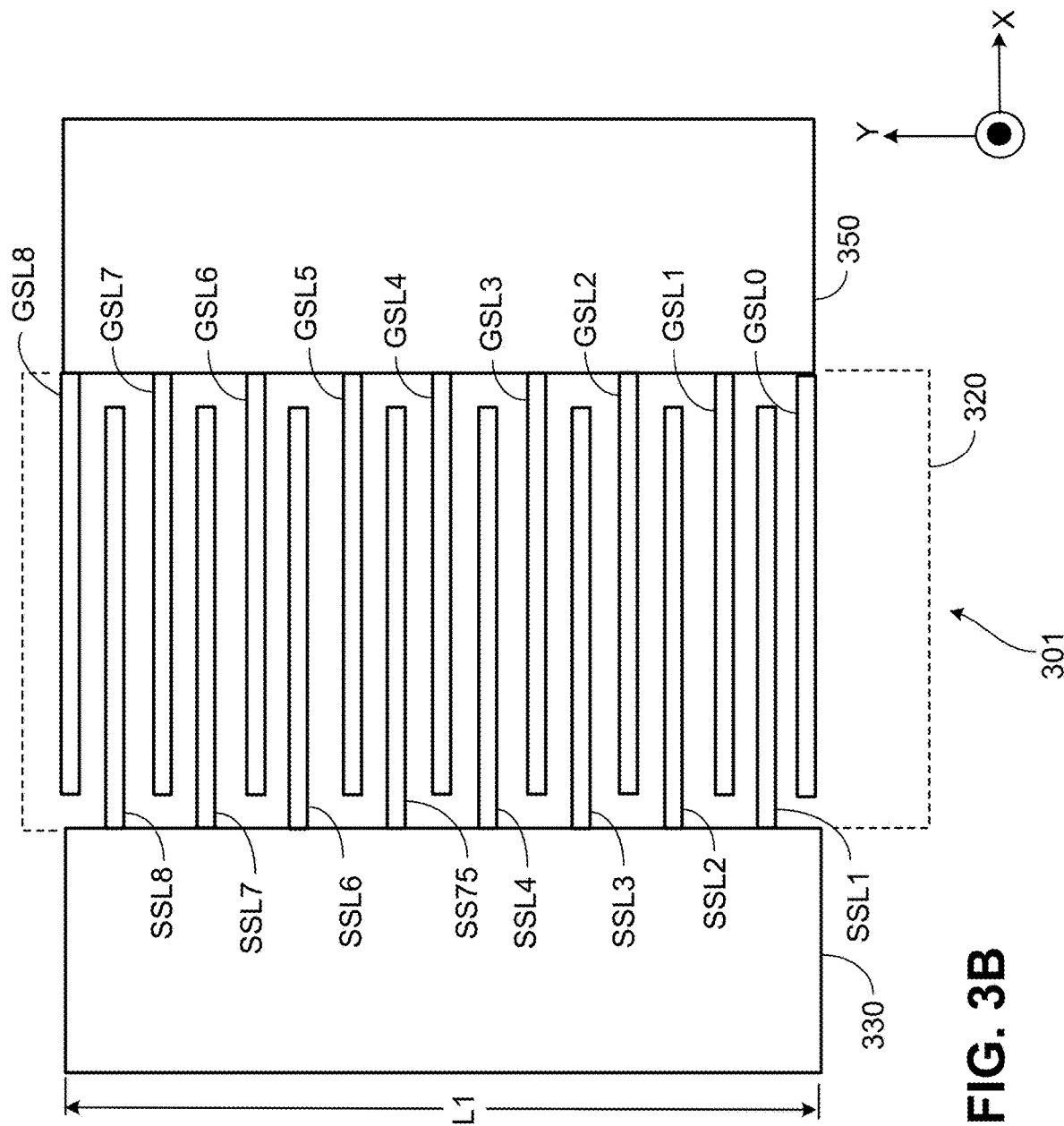
FIG. 3B illustrates a top view of an example memory block of a memory cell array.

FIG. 3B illustrates an example memory block of a memory cell array. In particular, FIG. 3B illustrates the memory block 301 of the memory cell array viewed in the X-Y plane. For example, the memory cell string 310 in FIG. 3A can be a memory cell string included in the memory block 301.

The memory block 301 includes a cell array area 320, a first word line pad 330 and a second word line pad 350. The cell array area 320 includes multiple memory cell strings. Each of the memory cell strings is coupled to the first word line pad 330 through a respective string select line of string select lines SSL1-SSL8. Each of the memory cell strings is coupled to the second word line pad 350 through a respective ground select line of ground select lines GSL0-GSL8. That is, for each memory cell string, one end of the memory cell string is coupled to the first word line pad 330 through a respective string select line and the other end of the memory cell string is coupled to the second word line 350 through a respective ground select line. As shown in FIG. 3B, the string select lines and the ground select lines can be arranged in an alternating interdigitated pattern. The string select lines and the ground select lines can extend in parallel along the X-axis, and can alternate along the Y-axis.

When programming the memory cells in the memory cell array, a memory controller can program memory cells by selecting a particular string select line. Once the memory controller selects a particular string select line, the memory controller programs one or more memory cells coupled to the particular string select line. In some implementations, while the memory controller programs memory cells coupled to a particular string select line, the memory controller inhibit programming memory cells coupled to other string select lines in the same memory block to prevent interference between one group of memory cells coupled to one string select line and another group of memory cells coupled to another string select line. For example, the memory controller can program memory cells coupled to the string select line SSL1 first, and then program other memory cells coupled to other string select lines SSL2-SSL8 one by one. In this example, while the memory controller programs memory cells coupled the string select line SSL1, the memory controller can inhibit programming memory cells coupled to other string select lines SSL2-SSL8. Then, while the memory controller programs memory cells coupled the string select line SSL2, the memory controller can inhibit programming memory cells coupled to other string select lines SSL1, SSL3-SSL8. Thus, to program memory cells in one memory block, the memory controller should program multiple times, e.g., eight times. This multiple programming can cause the tail-bit problem. The tail bit problem will be described in greater detail below with reference to FIG. 3C.

Figure 3C:
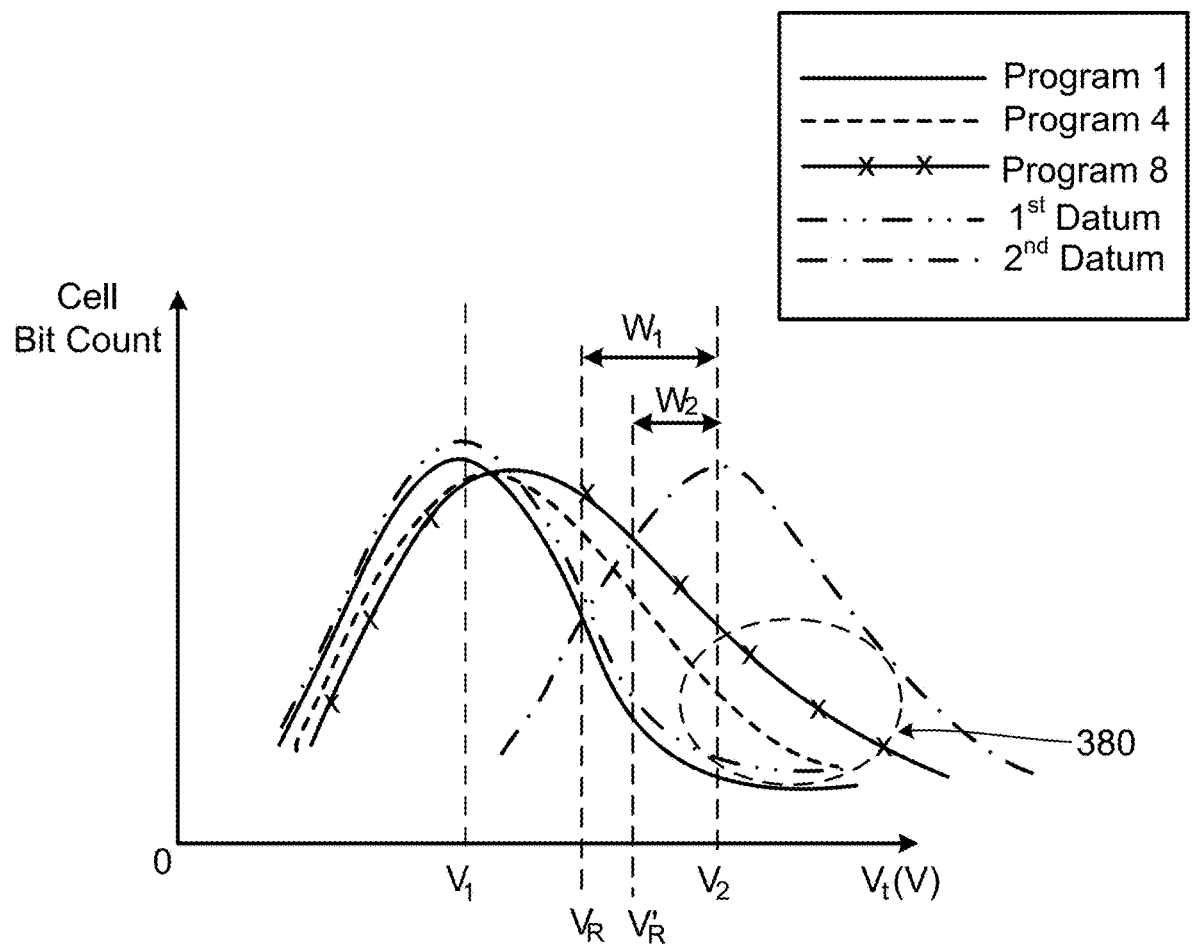
FIG. 3C illustrates an example graph to show multiple level programming for a memory cell.

FIG. 3C illustrates an example graph to show error rates when programming a memory cell. The X-axis represents a threshold voltage, e.g., the threshold voltage $V_t$, at a memory cell and the Y-axis represents cell bit count. For example, a memory controller can erase/inhibit or program two bits data by applying two different levels of a voltage, e.g., a first voltage level $V_1$ and a second voltage level $V_2$, to a memory cell. When the memory controller provides the first voltage level $V_1$ to a memory cell, a datum programmed to the memory cell is erased or inhibited. When the memory controller provides the second voltage level $V_2$ to a memory cell, a datum is programmed to the memory cell. In FIG. 3C, the curve Erase/Inhibit shows a threshold voltage $V_t$ distribution curve when a voltage to erase or inhibit a datum to a memory cell is applied and the curve Program shows a threshold voltage $V_t$ distribution curve when a voltage to program a datum to a memory cell is applied. When a voltage greater than the first voltage level $V_1$ and smaller than a first reference voltage $V_R$ is applied, a datum programmed in the memory cell is erased or inhibited. When a voltage greater than the first reference voltage $V_R$ and smaller than the second voltage level $V_2$ is applied, a datum is programmed to the memory cell. Thus, a width of a window to program the second datum can be a first width $W_1$.

However, as programming sessions are repeated, the tail gate problem occurs. That is, as programming sessions are repeated, some inhibited cells have higher voltage levels of the threshold voltage $V_t$ at the high bound of the threshold voltage $V_t$ distribution, and results in the higher RBER (Residue Bit Error Rate). The curve Program 4 shows that voltage levels of the threshold voltage $V_t$ at the high bound of the threshold voltage $V_t$ distribution becomes higher at the first reference voltage $V_R$ than the curve Program 1 and the curve Program 8 shows that voltage levels of the threshold voltage $V_t$ at the high bound of the threshold voltage $V_t$ distribution becomes higher at the first reference voltage $V_R$ than the curve Program 4. Based on the curve Program 8 and the curve $2^{nd}$ Datum, when a voltage greater than the first voltage level $V_1$ and smaller than a second reference voltage $V_R'$ is applied, a datum programmed in the memory cell is erased or inhibited. When a voltage greater than the second reference voltage $V_R'$ and smaller than the second voltage level $V_2$ is applied, a datum is programmed to the memory cell. Thus, a width of a window to program the second datum can be a second width $W_2$ such that the window to program the second datum is reduced by the difference between the first width $W_1$ and the second width $W_2$.

Figure 4A:
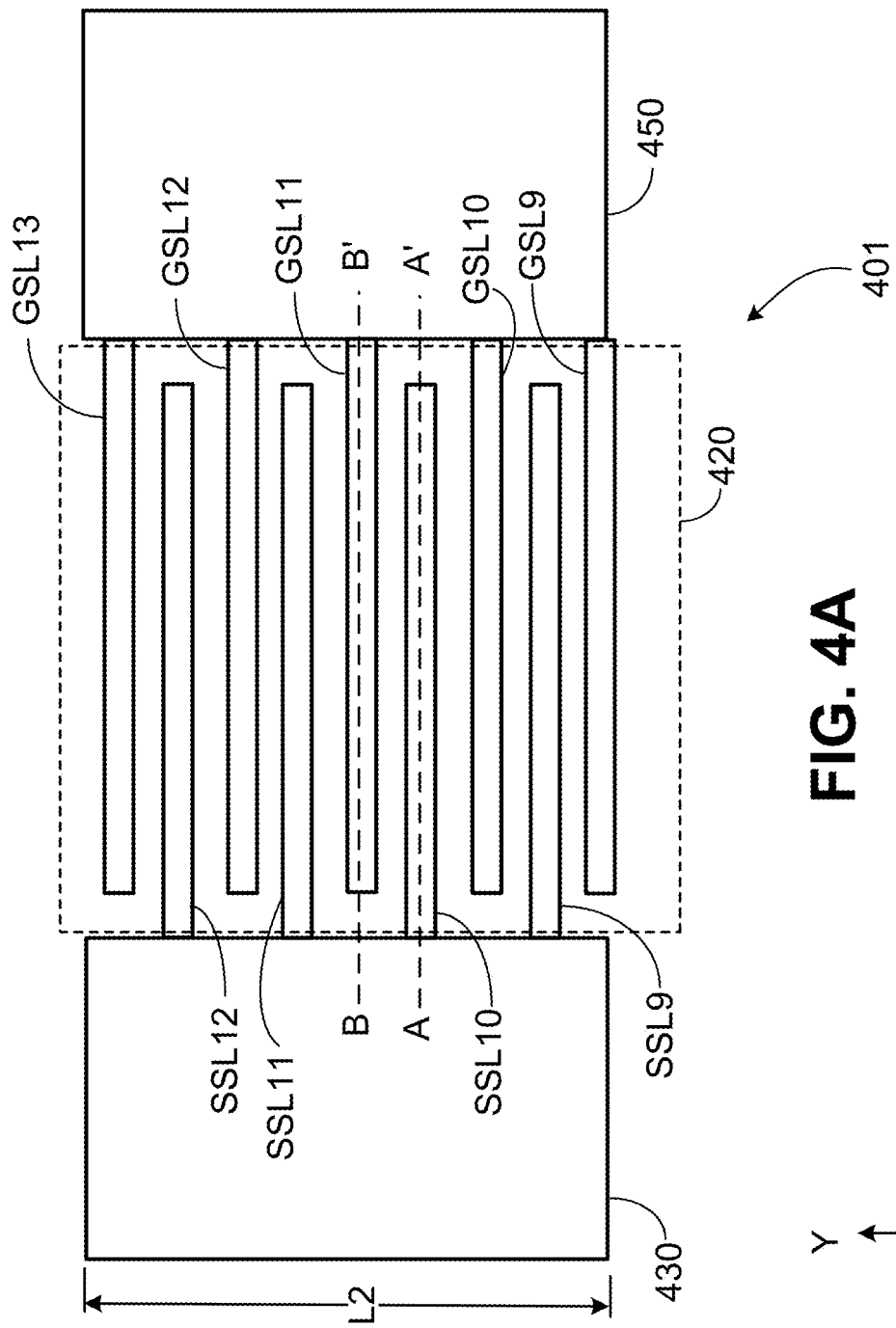
FIG. 4A illustrates a top view of another example memory block in a memory cell array.

FIG. 4A illustrates another example memory block of a memory cell array. In particular, FIG. 4A illustrates the memory block 401 of the memory cell array viewed in the X-Y plane. For example, the memory cell string 200 in FIG. 2 can be a memory cell string included in the memory block 401.

The memory block 401 includes a cell array area 420, a first word line pad 430 and a second word line pad 450. The cell array area 420 includes multiple memory cell strings. The structure of the memory string cell in the cell array area 420 can be the same or similar to the structure of the memory string cell 310 in FIG. 3A. Each of the memory cell strings is coupled to the first word line pad 430 through a respective string select line of string select lines SSL9-SSL12. Each of the memory cell strings is coupled to the second word line pad 450 through a respective ground select line of ground select lines GSL9-GSL13. That is, for each memory cell string, one end of the memory cell string is coupled to the first word line pad 430 through a respective string select line and the other end of the memory cell string is coupled to the second word line 450 through a respective ground select line. The string select lines and ground select lines can be arranged in an alternating interdigitated pattern. The string select lines and ground select lines can extend in parallel along the X-axis, and can alternate along the Y-axis.

Comparing to the memory block 301 in FIG. 3A, the memory block 401 includes a smaller number of string select lines. In this example, for convenience, the memory block 401 includes four string select lines while the memory block 301 includes eight string select lines. As described above, when programming memory cells, a memory controller can program by a memory cell string. That is, the memory controller programs memory cells in one memory cell string and, after completing programming memory cells in the memory cell string, the memory controller programs the next memory cell string. Since the memory block 401 includes four string select lines, the memory controller programs four times to program memory cells in the memory block 401. Thus, comparing to a case in which the memory controller programs memory cells in the memory block 301, the memory controller can reduce the number of programming sessions from eight to four. Since the number of programming is reduced, the tail-bit problem can be prevented or reduced, reducing programming errors.

However, since both the memory block 401 and the memory block 301 includes 32 word lines, the word line sharing rate, i.e., how many string select lines are shared by one word line, is reduced from 50% (16 string select lines per 32 word lines) to 25% (8 string select lines per 32 word lines). The low word line sharing rate represents that word line pitch becomes small. In the memory device, if a word line pitch becomes less than a threshold value, e.g., 0.1 um, high electric-field is generated between two adjacent word lines, causing dielectric breakdown in the memory cell. Thus, to prevent the dielectric breakdown in the memory cell, the word line pitch should not become small in the memory block 401 even if the memory block 401 includes less string select lines than the memory block 301 to reduce the number of programming.

Figure 4B:
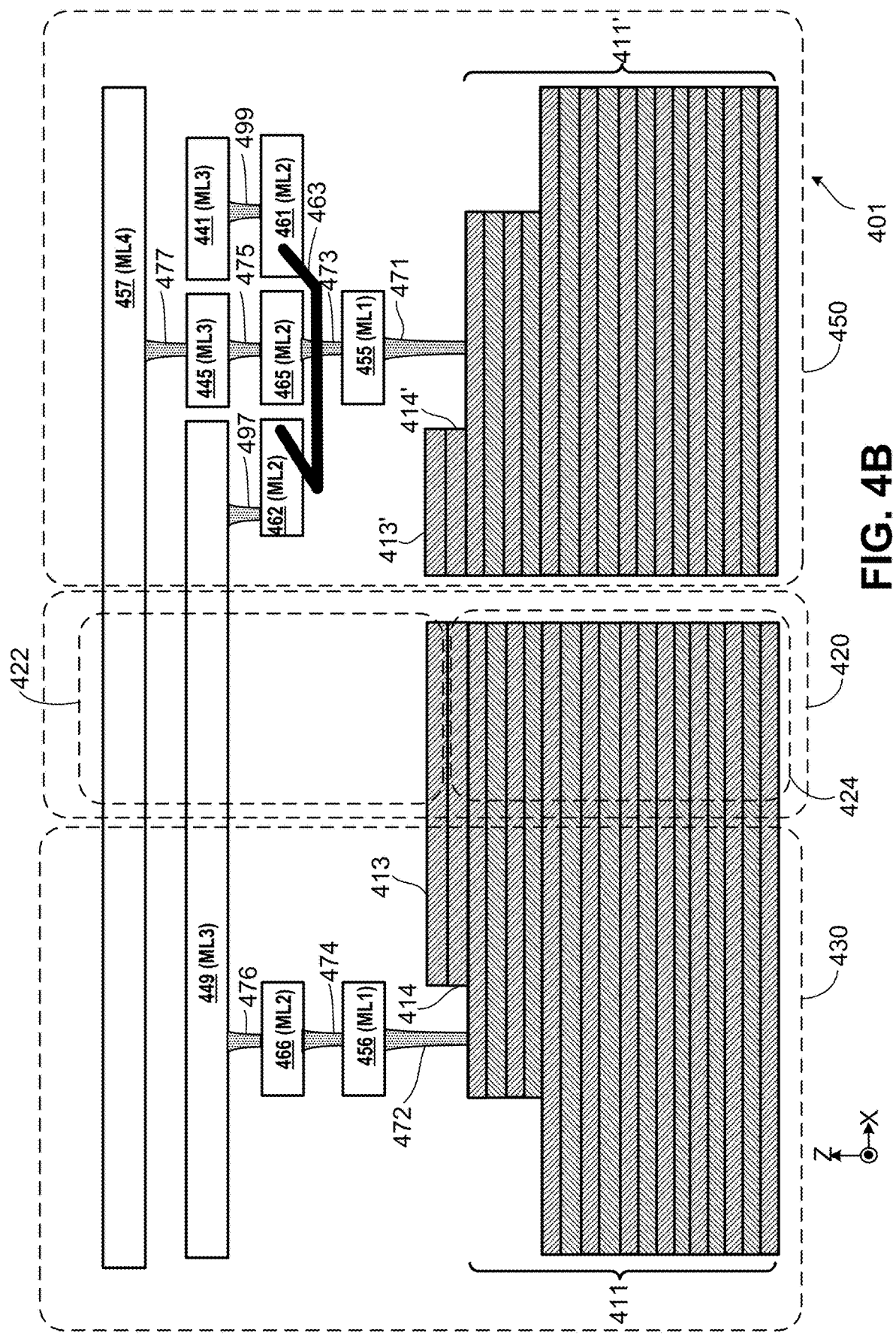
FIG. 4B illustrates a cross-sectional view of an example memory block corresponding to A-A' illustrated in FIG. 4A.
Figure 4C:
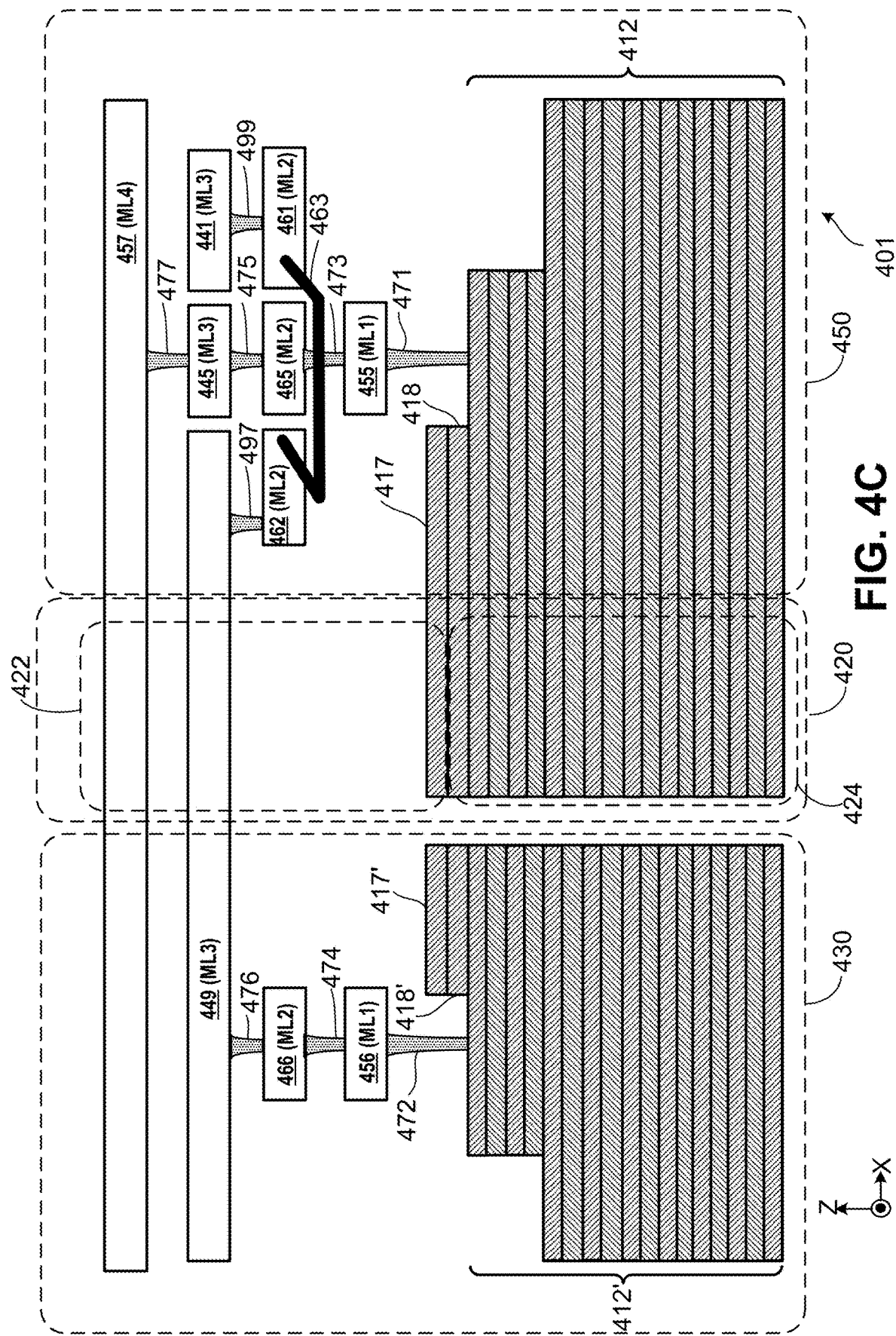
FIG. 4C illustrates a cross-sectional view of an example memory block corresponding to B-B' illustrated in FIG. 4A.
Figure 4D:
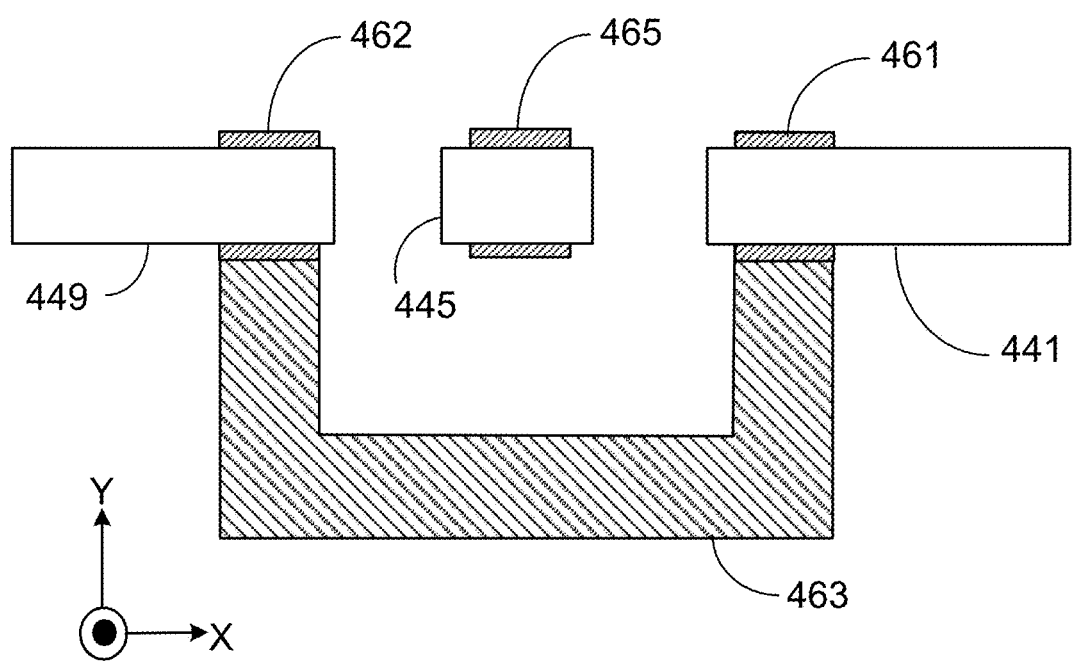
FIG. 4D illustrates an example second word line pad of a memory block.
Figure 4E:
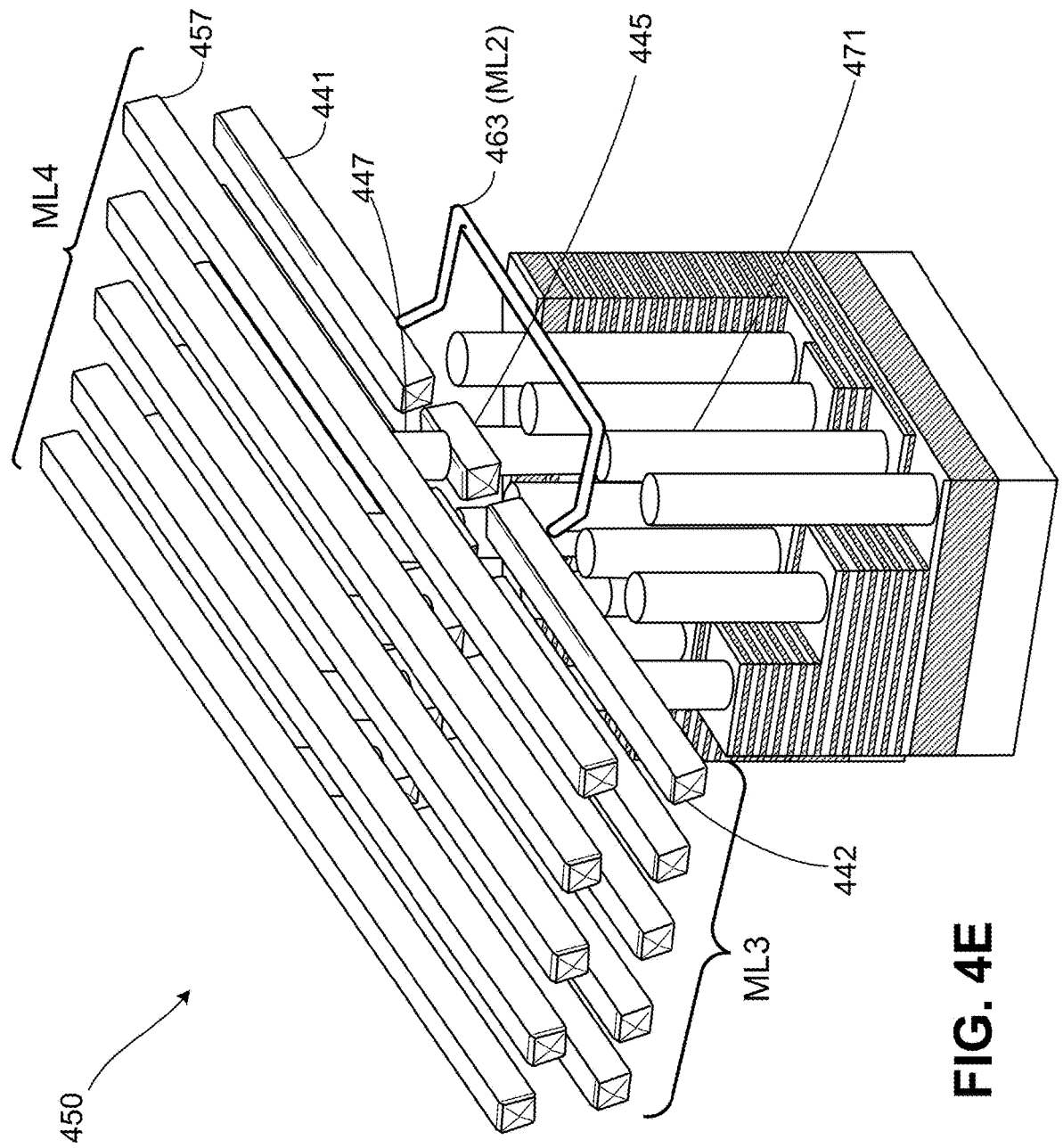
FIG. 4E illustrates an example second word line pad of a memory block in a 3D view.

FIGS. 4B to 4E illustrate an example structure of a memory block in a memory cell array. In particular, FIG. 4B illustrates a cross-sectional view of a memory block 401 corresponding to A-A' illustrated in FIG. 4A in the X-Z plane, FIG. 4C illustrates a cross-sectional view of a memory block 401 corresponding to B-B' illustrated in FIG. 4A in the X-Z plane, FIG. 4D illustrates a second word line pad 450 of the memory block 401 in the X-Y plane, and FIG. 4E illustrates the second word line pad 450 of the memory block 401 in a 3D view. In some implementations, the memory cell array including the memory block 401 can be the memory cell array 104 described with reference to FIG. 1.

With reference to FIG. 4B, the memory block 401 includes a cell array area 420, a first word line pad 430, and a second word line pad 450. The cell array area 420 includes multiple memory cell strings comprising respective memory cells. The cell array area 420 includes peripheral layers 422 and array layers 424. The peripheral layers 422 can include two metal layers (e.g., metal layers ML3, ML4) and a film layer 413 (e.g., a SSL/GSL film layer). In some implementations, the film layer 413 can be a conductive layer. In some implementations, multiple film layers can be formed. The metal layers ML3, ML4 are extended to the first word line pad 430 and the second word line pad 450 for routing signals between memory cells in the cell array area 420 and a control unit, e.g., a row decoder, a column decoder, or a voltage supplier, through the first word line pad 430 or the second word line pad 450. In some implementations, the structure of the array layers 424 can be the same or similar to the structure of the array layers described with reference to FIG. 3A.

In FIG. 4B, the array layer 424 includes multiple word lines 411 and a dielectric film layer 414 (e.g., a polysilicon oxide layer) that is formed over the word lines 411. In some implementations, multiple dielectric film layers can be formed. In FIG. 4B, for convenience, elements other than the metal layers ML3, ML4, the film layer 413, and the dielectric layer 414 are omitted. Like the peripheral layers 422, one or more layers of the array layers 424 are extended to the first word line pad 430 and the second word line pad 450 for routing signals between memory cells in the cell array area 420 and a control unit, e.g., a row decoder, a column decoder, or a voltage supplier, through the first word line pad 430 or the second word line pad 450. For example, the word lines 411, the film layer 413 and the dielectric film layer 414 are extended to the first word line pad 430. In this example, the word lines 411, the film layer 413, and the dielectric film layer 414 are disconnected at a border area between the cell array area 420 and the second word line pad 450. The second word line pad 450 includes multiple word lines 411', a film layer 413', and a dielectric film layer 414'.

With reference to FIG. 4C, the peripheral layers 422 can include two metal layers (e.g., metal layers ML3, ML4) and a film layer 417 (e.g., a SSL/GSL film layer). In some implementations, the film layer 417 can be a conductive layer. In some implementations, multiple film layers can be formed. The metal layers ML3, ML4 are extended to the first word line pad 430 and the second word line pad 450 for routing signals between memory cells in the cell array area 420 and a control unit, e.g., a row decoder, a column decoder, or a voltage supplier, through the first word line pad 430 or the second word line pad 450. In some implementations, the structure of the array layers 424 can be the same or similar to the structure of the array layers described with reference to FIG. 3A.

In FIG. 4C, the array layer 424 includes multiple word lines 412 and a dielectric film layer 418 (e.g., a polysilicon oxide layer) that is formed over the word lines 412. In some implementations, multiple dielectric film layers can be formed. In FIG. 4C, for convenience, elements other than the metal layers ML3, ML4, the film layer 417, and the dielectric layer 418 are omitted. Like the peripheral layers 422, one or more layers of the array layers 424 are extended to the first word line pad 430 and the second word line pad 450 for routing signals between memory cells in the cell array area 420 and a control unit, e.g., a row decoder, a column decoder, or a voltage supplier, through the first word line pad 430 or the second word line pad 450. For example, the word lines 412, the film layer 417 and the dielectric film layer 418 are extended to the second word line pad 450. In this example, the word lines 412, the film layer 417, and the dielectric film layer 418 are disconnected at a border area between the cell array area 420 and the first word line pad 430. The first word line pad 430 includes multiple word lines 412', a film layer 417', and a dielectric film layer 418'.

One or more layers of the array layers 424 can respectively include word lines and signal lines. In some implementations, the signal lines can include string select lines, ground select lines, dummy word lines, and inversion word lines. In some implementations, These lines including the word lines and the signal lines can be grouped as a first group of lines and a second group of lines. The lines can be grouped as any suitable combinations. For example, referring to FIG. 2, the first group of lines can include the string select line SSL, the dummy word lines DWLS2-DWLS0, the word lines WL31-WL16, and the inversion word line IWLS and the second group of lines can include the ground select line GSL, the dummy word lines DWLG0-DWLG2, the word lines WL0-WL15, and the inversion word line IWLG. As another example, the first group of lines can include the string select line SSL, the dummy word lines DWLS1, DWLG0, DWLG2, the word lines WL31, WL29, WL27, . . . , WL17, WL15, WL13, WL11, . . . , WL1, and inversion word line IWLG and the second group of lines can include the ground select line GSL, the dummy word lines DWLG1, DWLS0, DWLS2, the word lines WL0, WL2, WL4, . . . , WL14, WL16, WL18, WL20, . . . , WL30, and the inversion word line IWLS.

Referring back to FIG. 4B, the memory block 401 includes two metal routing layers ML3, ML4 to route the first group of lines and the second group of lines respectively. For example, the two metal routing layers ML3, ML4 can be used as global word lines that are coupled between a control unit (e.g., a row decoder, a column decoder, or a voltage supplier) and word lines. In some implementations, the metal layers ML3, ML4 are coupled to word lines, string select lines, or global source lines to route signals from/to the word lines, the string select lines, or the global source lines. In some implementations, the first group of lines are coupled to word lines through word line pads, e.g., the word line pads 430, 450, that are coupled to one or more memory cells in the array area 420. That is, the first group of lines are not directly coupled to memory cells in the array area 420, but coupled to the memory cells through the word line pads 430, 450.

In some implementations, with reference to FIG. 4B, the first group of lines can route signals from a control unit, e.g., a row decoder, a column decoder, or a voltage supplier, to word lines through the first word line pad 430. For example, the first route can include a metal line 449 that is formed in the third metal layer ML3, a first contact 476, a first metal post 466 that is formed in the second metal layer ML2, a second contact 474, a second metal post 456 that is formed in the first metal layer ML1, and a third contact 472. In this example, when the control unit provides a signal, e.g., a voltage, the signal is transferred through the metal line 449, the first contact 476, the first metal post 466, the second contact 474, the second metal post 456, and the third contact 472 to a word line of word lines 411 that is coupled to the third contact 472. The signal is transferred through the word line to a gate of a transistor to which the word line is coupled. In some implementations, the word line that is coupled to the third contact 472 can be one of the first group of lines described above.

In this example, the signal is also transferred from the control unit through the metal line 449, a fourth contact 497, a first portion 462 of the second metal layer ML2, a detouring portion 463 of the second metal layer ML2, and a second portion 461 of the second metal layer ML2, a fifth contact 499, and a metal line 441 that is formed in the third metal layer ML3. The metal line 441 that is formed in the third metal layer ML3 (the other metal routing layer in the memory block 401) can be extended to another memory block that is adjacent to the memory block 401. In some implementations, the contacts 476, 474, 472, 497, 499 can include one or more conductive materials, e.g., metal or polysilicon.

In some implementations, with reference to FIG. 4C, the second group of lines can route signals from a control unit, e.g., a row decoder, a column decoder, or a voltage supplier, to word lines 412 through the second word line pad 450. For example, the second route can include a metal line 457 that is formed in the fourth metal layer ML4, a first contact 477, a first metal post 445 that is formed in the third metal layer ML3, a second contact 475, a second metal post 465 that is formed in a second metal layer ML2, a third contact 473, a third metal post 455 that is formed in a first metal layer ML1, and a fourth contact 471. In this example, when the control unit provides a signal, e.g., a voltage, the signal is transferred through the metal line 457 that is formed in the fourth metal layer ML4 (one of the metal routing layers in the memory block 401), the first contact 477, the first metal post 445, the second contact 475, the second metal post 465, the third contact 473, the third metal post 455, and the fourth contact 471 to a word line of the word lines 412 that is coupled to the fourth contact 471. The signal is transferred through the word line to a gate of a transistor to which the word line is coupled. In some implementations, the word line that is coupled to the fourth contact 471 can be one of the second group of lines described above. In some implementations, the contacts 477, 475, 473, 471 can include one or more conductive materials, e.g., metal or polysilicon.

With reference to FIGS. 4B and 4C, the second metal layer ML2 is further from the word lines 411, 412 than the first metal layer ML1. However, a level of a metal layer is not limited to the examples illustrated in FIGS. 4B and 4C. The metal layers ML1, ML2 can be located at any suitable level in the memory block 401 for various design purposes. In other words, the "first" and "second" can be labels for the different metal layers, and need not refer to their ordinal position within a stack of metal layers.

With reference to FIGS. 4B, 4D, and 4E, since a portion of the third metal layer ML3 is used as the post 445 for the second route, the first route is discontinuous in the third metal layer ML3. Thus, the second metal layer ML2 can be used to connect the discontinuous portion of the third metal layer ML3. That is, as descried above, the discontinuous portion of the metal line 449 is routed to the second metal layer ML2 through the fourth contact 497. Since a portion of the second metal layer ML2 is used as the post 465 for the second route, the first route is discontinuous in the second metal layer ML2 again. Thus, the detouring portion 463 that is formed in the second metal layer ML2 is used to route the first portion 462 of the second metal layer ML2 to the second portion 461 of the second metal layer ML2. The second portion 461 of the second metal layer ML2 is routed back to the third metal layer ML3 through the contact 499. In this example, the detouring portion 463 is formed at the second metal layer ML2 rather than the third metal layer ML3 to reserve more room in the third metal layer ML3 such that the third metal layer ML3 can be used for other routing. In some implementations, a detouring portion can be formed at the third metal layer ML3. Thus, the detouring portion at the third metal layer ML3 couples the discontinuous portion of the metal line 442 to the metal line 441.

In some implementations, a different metal layer in the memory block 401 can be used for detouring. For example, to save back end of line (BEOL) layers, two metal routing layers ML2, ML3 can used as global word lines that are coupled between a control unit (e.g., a row decoder, a column decoder, or a voltage supplier) and word lines. In this example, a first metal layer ML1 can be used to connect the discontinuous portion of the third metal layer ML3. That is, the discontinuous portion of the metal line 449 in the third metal layer ML3 is routed to the first metal layer ML1 through a first post in the second metal layer ML2. The first post in the second metal layer ML2 couples the discontinuous portion of the metal line 449 to a first portion of the first metal layer ML1. Since a portion 455 of the first metal layer ML1 is used as the post 455 for the second route, the first route is discontinuous in the first metal layer ML1. Thus, a detouring portion similar to the detouring portion 463 can be used to route the first portion of the first metal layer ML1 to a second portion of the first metal layer ML1. The second portion of the first metal layer ML1 is routed back to the third metal layer ML3 through a second post in the second metal layer ML2. That is, the second post in the second metal layer ML2 couples the second portion of the first metal layer ML1 to the metal line 441 in the third metal layer ML3.

In some other implementations, where two metal routing layers ML2, ML3 are used as global word lines that are coupled between a control unit (e.g., a row decoder, a column decoder, or a voltage supplier) and word lines, a first metal layer ML1 can be used to connect the discontinuous portion of the second metal layer ML2. In this example, the discontinuous portion of the metal line of the second metal layer ML2 is routed to the first metal layer ML1. That is, the discontinuous portion of the second metal layer ML2 is coupled to a first portion of the first metal layer ML1. As described above, since the portion 455 of the first metal layer ML1 is used as the post 455 for the second route, the first route is discontinuous in the first metal layer ML1. Thus, a detouring portion similar to the detouring portion 463 can be used to route the first portion of the first metal layer ML1 to a second portion of the first metal layer ML1. The second portion of the first metal layer ML1 is routed back to the second metal layer ML2.

In some implementations, the layout of the fourth metal layer ML4 can be physically aligned with the third metal layer ML3. In some implementations, the pitch of the metal line 457 can be the same as the pitch of the metal lines 441, 449. These features can simplify the manufacturing process. In addition, by matching the pitches, wire connection between two different metal layers can be easy.

In some implementations, the word lines 411 coupled to the control unit through the first pad 430 in FIG. 4B can be the word lines WL31-WL16 in FIG. 2 and the word lines 412 coupled to the control unit through the second pad 450 in FIG. 4C can be the word lines WL15-WL0 in FIG. 2. In some implementations, the word lines 411 coupled to the control unit through the first pad 430 in FIG. 4B can be the word lines WL0-WL15 in FIG. 2 and the word lines 412 coupled to the control unit through the second pad 450 in FIG. 4C can be the word lines WL16-WL31 in FIG. 2. However, the routing combination through the first pad 430 and the second pad 450 is not limited to the implantations described above, any suitable routing combinations can be used.

By implementing two metal layers ML3, ML4 in the memory block 401, the word line pitch for the memory block 401 does not become small even if the memory block 401 includes fewer string select lines than the memory block 301. With reference to FIGS. 3A and 3B, the memory block 301 includes 8 string select lines, one ground select line (Although FIGS. 3A and 3B shows 9 ground select lines, they are counted once because all ground select lines are coupled to the same ground), one common source line, 32 word lines, three dummy word lines (in this example, the memory block 301 includes three pairs of dummy word lines where one pair of dummy word lines share a common gate. Thus, to calculate an average pitch, three word lines are counted. However, in some implementations, where dummy word lines do not share a common gate, different calculation methods can be used to calculate an average pitch), and two inversion word lines (in this example, the memory block 301 includes one pair of inversion word lines sharing a common gate. Thus, to calculate an average pitch, one word line is counted. However, in some implementations, where inversion word lines do not share a common gate, different calculation methods can be used to calculate an average pitch). Thus, the memory block 301 includes 47 lines. Assuming a length L1 of the memory block 301 is 7.26 um, an average pitch is:

$$7.26/47=0.15 \text{ um.}$$

With reference to FIG. 4A, the memory block 401 includes 4 string select lines, one ground select line, one common source line, 32 word lines, three dummy word lines, and two inversion word lines. Thus, the memory block 401 includes 43 lines. Assuming a length L2 of the memory block 401 is 3.74 um, an average pitch is:

$$3.74\times2/43=0.17 \text{ um.}$$

In this formula, since the memory block 401 includes dual metal layers for routing as described above with reference to FIG. 4B, the length L2 of the memory block 401 is doubled. As a result, by implementing two metal routing layers, the average pitch for the memory block 401 does not become small even if the memory block 401 includes less string select lines than the memory block 301.

The disclosed and other examples can be implemented as one or more computer program products, for example, one or more modules of computer program operations encoded on a computer readable medium for execution by, or to control the operation of, data processing apparatus. The implementations can include single or distributed processing of algorithms. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive operations and data from a read only memory or a random access memory or both. The essential elements of a computer can include a processor for performing operations and one or more memory devices for storing operations and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program operations and data can include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A memory device comprising:
   a memory controller;
   one or more control units; and
   a memory cell array that includes one or more memory blocks, each of the one or more memory blocks comprising:
   a plurality of memory cells,
   a plurality of word lines that are respectively coupled to the plurality of memory cells,
   a plurality of signal lines to transfer signals to perform programming operations to one or more memory cells of the plurality of memory cells, wherein the plurality of signal lines include string select lines, common source lines, ground select lines, dummy word lines, and inversion word lines,
   a first metal layer that is coupled to a first group of lines and that is configured to route the first group of the lines to at least one of the one or more control units, the lines comprising the plurality of word lines and the plurality of signal lines, and
   a second metal layer that is coupled to a second group of the lines and that is configured to route the second group of the lines to at least one of the one or more control units,
   wherein the memory controller is configured to:
   control at least one of the one or more control units to (i) select one or more particular memory cells and (ii) program one or more data to the one or more particular memory cells.

2. The memory device of claim 1, wherein the first metal layer includes a first routing line that is coupled to at least one of the one or more control units and the second metal layer includes a second routing line that is coupled to at least one of the one or more control units.

3. The memory device of claim 2, wherein a pitch for the first routing line is the same as a pitch for the second routing line.

4. The memory device of claim 2, wherein the first routing line is aligned with the second routing line.

5. The memory device of claim 1, wherein the second metal layer is discontinuous between a first portion and a second portion, and
   wherein the first portion of the second metal layer is coupled to the second portion of the second metal layer through a detouring portion of the second metal layer.

6. The memory device of claim 1, further comprising:
   a first conductive layer that is adjacent to the second metal layer,
   wherein the second metal layer is discontinuous between a first portion and a second portion, and wherein the first portion of the second metal layer is coupled to the first conductive layer and the second portion of the second metal layer is coupled to the first conductive layer such that a signal is transferred between the first portion and the second portion through the first conductive layer.

7. The memory device of claim 1, further comprising:

a first conductive layer that is adjacent to the second metal layer, wherein the second metal layer is discontinuous between a first portion and a second portion, wherein the first conductive layer is discontinuous between a third portion and a fourth portion, and wherein (i) the first portion of the second metal layer is coupled to the third portion of the first conductive layer, (ii) the second portion of the second metal layer is coupled to the fourth portion of the first conductive layer, and (iii) the third portion of the first conductive layer is coupled to the fourth portion of the first conductive layer through a detouring portion of the first conductive layer such that a signal is transferred between the first portion and the second portion through the third portion, the detouring portion, and the fourth portion of the first conductive layer.

8. The memory device of claim 1, wherein an average pitch for the lines is more than 0.1 um.

9. The memory device of claim 1, wherein the second metal layer is further from the lines than the first metal layer.

10. A method for programming one or more data to one or more memory cells of a memory device, the method comprising:

receiving addresses for one or more memory cells to program;

selecting, based on the addresses, the one or more memory cells to program through a plurality of word lines that are respectively coupled to a plurality of memory cells in the memory device and a plurality of signal lines that are configured to transfer signals to perform programming operations to the one or more memory cells, wherein the plurality of signal lines include string select lines, common source lines, ground select lines, dummy word lines, and inversion word lines; and applying, by a memory controller, one or more voltages to the one or more memory cells to program the one or more memory cells through the plurality of word lines and the plurality of signal lines, wherein a first metal layer is coupled to a first group of lines and is configured to route the first group of the lines to at least one of one or more control units, the lines comprising the plurality of word lines and the plurality of signal lines, and wherein a second metal layer is coupled to a second group of the lines and is configured to route the second group of the lines to at least one of the one or more control units.

11. The method of claim 10, wherein the first metal layer includes a first routing line that is coupled to at least one of the one or more control units and the second metal layer includes a second routing line that is coupled to at least one of the one or more control units.

12. The method of claim 11, wherein a pitch for the first routing line is the same as a pitch for the second routing line.

13. The method of claim 11, wherein the first routing line is aligned with the second routing line in a particular direction.

14. The method of claim 10, wherein the second metal layer is discontinuous between a first portion and a second portion, and wherein the first portion of the second metal layer is coupled to the second portion of the second metal layer through a detouring portion of the second metal layer.

15. The method of claim 10, wherein the memory device further comprises:

a first conductive layer that is adjacent to the second metal layer, wherein the second metal layer is discontinuous between a first portion and a second portion, and wherein the first portion of the second metal layer is coupled to the first conductive layer and the second portion of the second metal layer is coupled to the first conductive layer such that a signal is transferred between the first portion and the second portion through the first conductive layer.

16. The method of claim 10, wherein the memory device further comprises:

a first conductive layer that is adjacent to the second metal layer, wherein the second metal layer is discontinuous between a first portion and a second portion, wherein the first conductive layer is discontinuous between a third portion and a fourth portion, and wherein (i) the first portion of the second metal layer is coupled to the third portion of the first conductive layer, (ii) the second portion of the second metal layer is coupled to the fourth portion of the first conductive layer, and (iii) the third portion of the first conductive layer is coupled to the fourth portion of the first conductive layer through a detouring portion of the first conductive layer such that a signal is transferred between the first portion and the second portion through the third portion, the detouring portion, and the fourth portion of the first conductive layer.

17. The method of claim 10, wherein an average pitch for the lines is more than 0.1 um.

18. The method of claim 10, wherein the second metal layer is further from the lines than the first metal layer.

* * * * *